United States Patent
Lee et al.

(10) Patent No.: US 7,295,437 B2
(45) Date of Patent: Nov. 13, 2007

(54) HEAT DISSIPATION DEVICE FOR MULTIPLE HEAT-GENERATING COMPONENTS

(75) Inventors: Hsieh-Kun Lee, Tu-Cheng (TW); Wan-Lin Xia, Shenzhen (CN); Tao Li, Shenzhen (CN); Min-Qi Xiao, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 16 days.

(21) Appl. No.: 11/266,044

(22) Filed: Nov. 3, 2005

(65) Prior Publication Data

US 2006/0238982 A1 Oct. 26, 2006

(30) Foreign Application Priority Data

Apr. 22, 2005 (CN) ......................... 2005 1 0034358

(51) Int. Cl.
*H05K 7/20* (2006.01)
(52) U.S. Cl. ...................... 361/700; 361/698; 361/702; 361/703; 361/709
(58) Field of Classification Search ........... 165/104.33, 165/104.21, 80.3, 185, 104.26, 67, 76, 80.4; 361/697, 698, 699, 700, 704, 702, 703, 709; 257/714, 715, 716; 174/15.2, 16.3
See application file for complete search history.

(56) References Cited

U.S. PATENT DOCUMENTS

| | | | |
|---|---|---|---|
| 6,487,076 B1 | 11/2002 | Wang | |
| 6,600,649 B1 | 7/2003 | Tsai et al. | |
| 6,903,930 B2 | 6/2005 | DiStefano et al. | |
| 6,909,608 B2 | 6/2005 | Fan | |
| 6,918,429 B2* | 7/2005 | Lin et al. | 165/80.3 |
| 7,013,960 B2* | 3/2006 | Lee et al. | 165/104.33 |
| 7,019,974 B2* | 3/2006 | Lee et al. | 361/700 |
| 7,028,758 B2* | 4/2006 | Sheng et al. | 165/104.21 |
| 7,100,681 B1* | 9/2006 | Wu et al. | 165/104.33 |
| 2004/0112583 A1 | 6/2004 | Garner et al. | |
| 2004/0165350 A1* | 8/2004 | Fan | 361/700 |
| 2005/0092465 A1* | 5/2005 | Lin et al. | 165/104.21 |
| 2005/0103476 A1* | 5/2005 | Chen et al. | 165/104.33 |
| 2005/0141198 A1* | 6/2005 | Lee et al. | 361/700 |
| 2005/0241808 A1* | 11/2005 | Lee et al. | 165/104.33 |
| 2005/0247437 A1* | 11/2005 | Ying et al. | 165/104.33 |
| 2005/0263265 A1* | 12/2005 | Sheng et al. | 165/104.21 |

(Continued)

*Primary Examiner*—Lisa Lea-Edmonds
*Assistant Examiner*—Anthony M Haughton
(74) *Attorney, Agent, or Firm*—Morris Manning Martin LLP; Tim Tingkang Xia, Esq.

(57) ABSTRACT

A heat dissipation device includes a first heat sink (10), a second heat sink (20) and four heat pipes (30) thermally connecting the first heat sink and second heat sink. The first heat sink comprises a plurality of first heat dissipation fins (14) and the second heat sink comprises a plurality of second heat dissipation fins (24). Each heat pipe comprises an evaporating portion (32) and a condensing portion (34). The evaporating portions of two heat pipes thermally engage in a base of the first heat sink and the condensing portions thereof connect the first and second heat dissipation fins. The evaporating portions of the other two heat pipes thermally engage in a base of the second heat sink and the condensing portions thereof connect the second and first heat dissipation fins.

11 Claims, 3 Drawing Sheets

U.S. PATENT DOCUMENTS

2006/0032617 A1* 2/2006 Chen et al. ............ 165/104.33
2006/0054307 A1* 3/2006 Lee et al. .................. 165/80.3
2006/0291172 A1* 12/2006 Lee et al. ................... 361/719

* cited by examiner

HEAT DISSIPATION DEVICE FOR MULTIPLE HEAT-GENERATING COMPONENTS

BACKGROUND

1. Field

The present invention relates generally to a heat dissipation device, and more particularly to a heat dissipation device using heat pipes for enhancing heat removal from at least two heat-generating components simultaneously.

2. Prior Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desired to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer.

A conventional heat dissipation device comprises a heat sink and at least a pair of heat pipes. The heat sink comprises a base and a plurality of fins extending from the base. The base defines two grooves in a top surface thereof, and a bottom surface of the base is attached to an electronic component. Each heat pipe has an evaporating portion accommodated in one of the grooves and a condensing portion inserted in an upper portion of the fins. The base absorbs heat produced by the electronic component and transfers the heat to the fins through the heat pipes and a connection between the fins and the base. By the provision of the heat pipes, heat dissipation efficiency of the heat dissipation device is improved.

However, as computer technology becomes more and more complicated, more than one heat-generating electronic components, for example, two central processing units (CPUs) could be used in a computer system. Such a dual-CPU computer system generates more heat and makes the heat dissipation more difficult since the two CPUs may form a synergy effect of heat generation. How to resolve the thermal problem of computer system having multiple heat sources becomes an issue to those engaging in computer industry.

SUMMARY

What is needed is a heat dissipation device with heat pipes for enhancing heat removal from multiple heat-generating components.

A heat dissipation device in accordance with a preferred embodiment of the present invention comprises a first heat sink, a second heat sink and two pairs of heat pipes connecting the first heat sink and second heat sink. The first heat sink is used for contacting with a first heat-generating electronic component and the second heat sink is used for contacting with a second heat-generating electronic component of a computer system. The first heat sink comprises a plurality of first heat dissipation fins and the second heat sink comprises a plurality of second heat dissipation fins. Each heat pipe comprises an evaporating portion and a condensing portion. The evaporating portions of one pair of the heat pipes engage in a base of the first heat sink and the condensing portions thereof connect the first and second heat dissipation fins. The evaporating portions of the other pair of the heat pipes engage in a base of the second heat sink and the condensing portions thereof portion connect the second and first heat dissipation fins.

Other advantages and novel features of the invention will become more apparent from the following detailed description when taken in conjunction with the accompanying drawings, in which:

DETAILED DESCRIPTION OF THE INVENTION

Figure 1:
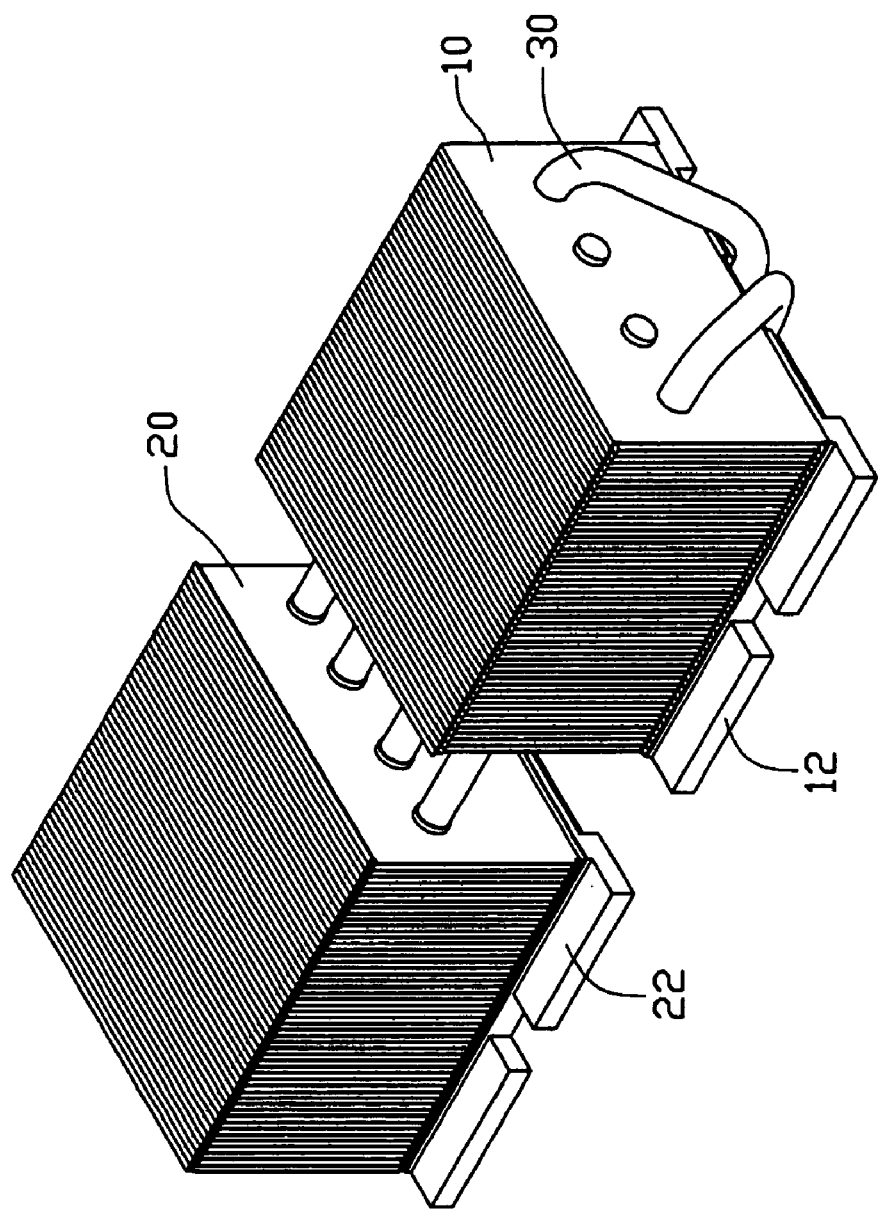
FIG. 1 is an assembled view of a heat dissipation device in accordance with a preferred embodiment of the present invention with a first heat sink and a second heat sink.

FIG. 1 shows a heat dissipation device in accordance with a preferred embodiment of the present invention. The heat dissipation device comprises a first heat sink 10, a second heat sink 20 and two pair of heat pipes 30.

Figure 2:
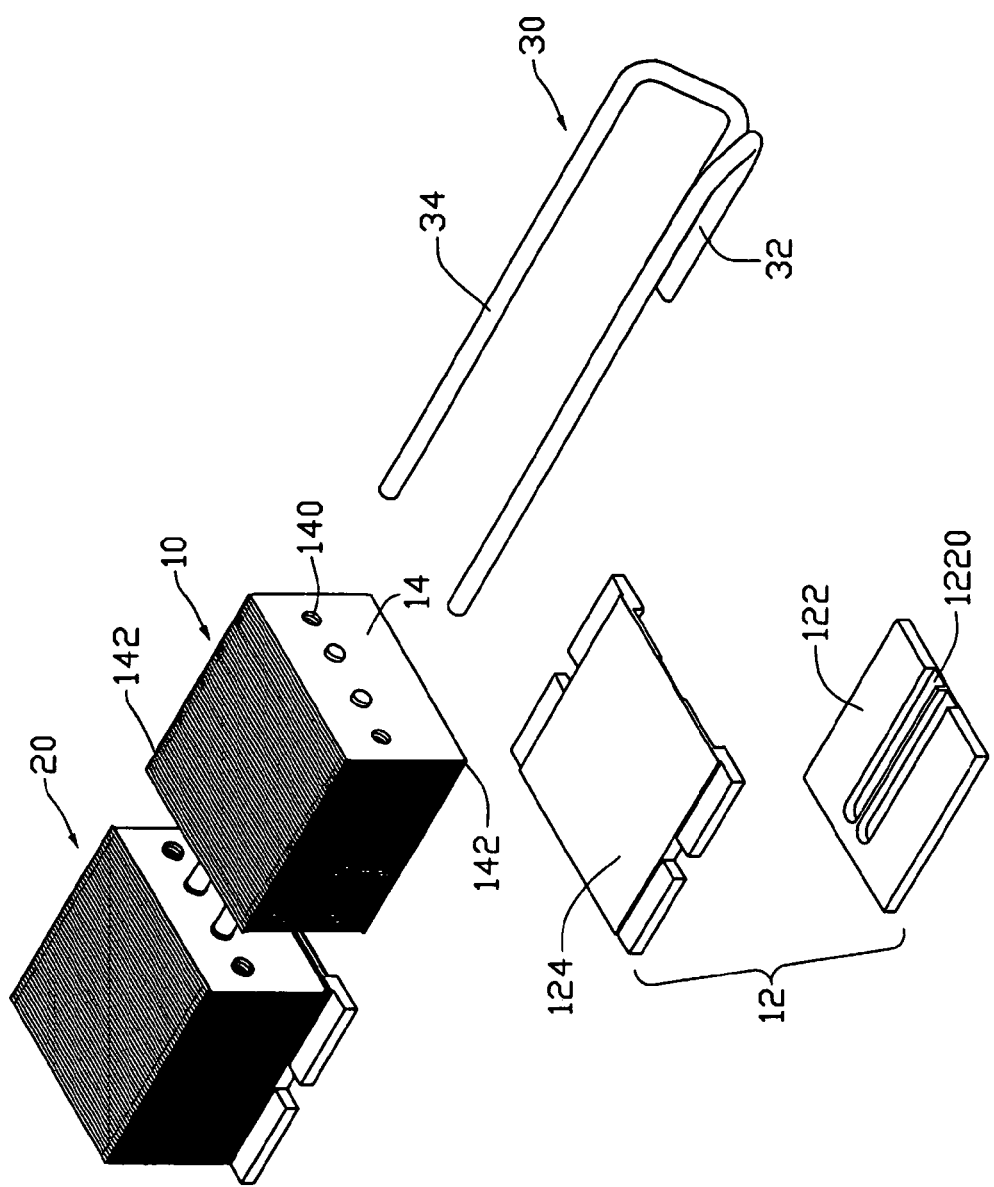
FIG. 2 is a partially exploded view of the heat dissipation device of FIG. 1.
Figure 3:
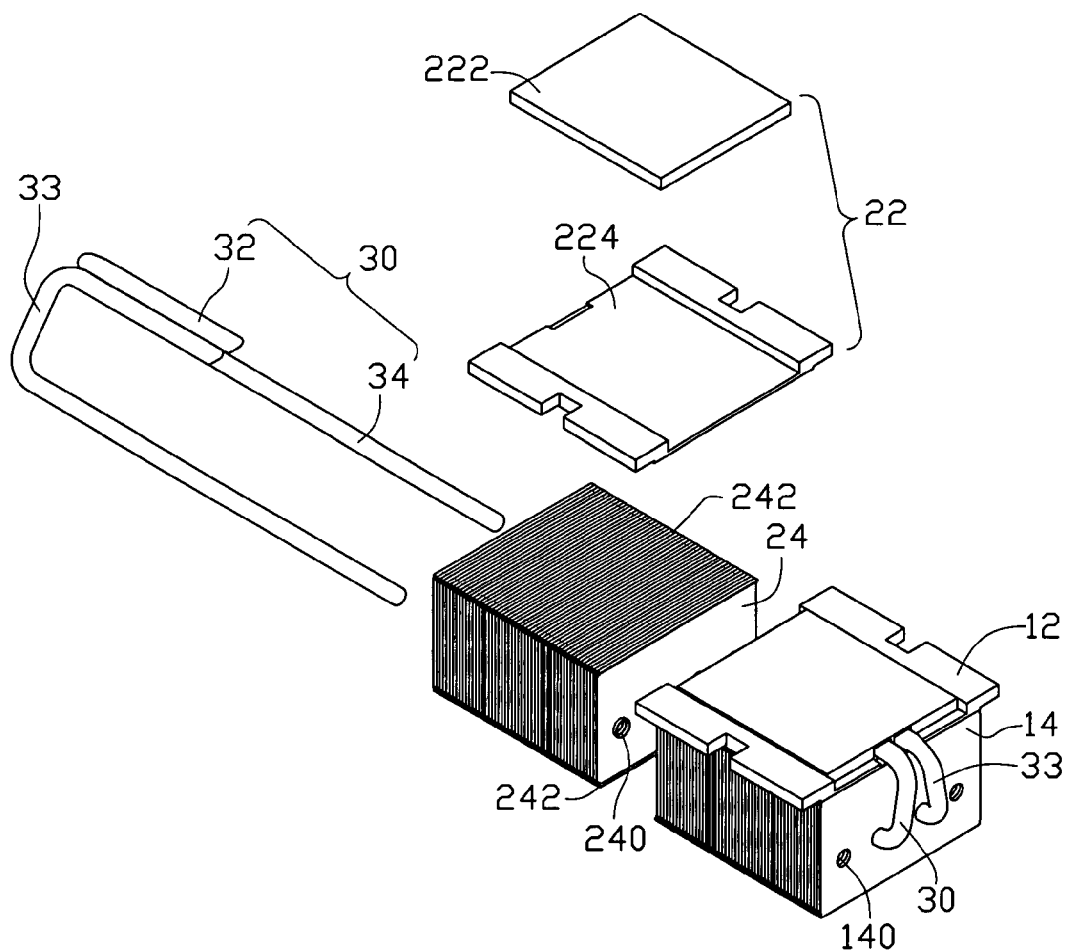
FIG. 3 is another partially exploded view of the heat dissipation device of FIG. 1, viewed from a bottom aspect.

Referring to FIGS. 2-3, the first heat sink 10 comprises a base 12 and a plurality of first heat dissipation fins 14 extending upwardly from the base 12. The base 12 comprises a bottom plate 122 and a top plate 124 attached on the bottom plate 122. The bottom plate 122 has a bottom surface for contacting with an electronic component (not shown) such as a first CPU and a top surface opposite the bottom surface. A pair of first grooves 1220 is defined in the top surface for accommodating the heat pipes 30. Each first heat dissipation fin 14 defines two pairs of holes 140 in a middle thereof for the heat pipes 30 to extend therein, and forms flanges 142 at top and bottom ends thereof. The flanges 142 cooperatively form a top plane (not labeled) and a bottom plane (not labeled) for the fins 14. The bottom plane is soldered to a top surface of the top plate 124.

The second heat sink 20 has a similar structure to the first heat sink 10. The second heat sink 20 comprises a base 22 and a plurality of second heat dissipation fins 24 extending upwardly from the base 22. The base 22 comprises a bottom plate 222 and a top plate 224 attached on the bottom plate 222. The top plate 224 defines a bottom recess (not labeled) receiving the bottom plate 222 therein. The bottom plate 222 has a bottom surface for contacting with another electronic component (not shown) such as a second CPU and a top surface opposite the bottom surface. A pair of second grooves (not shown) is defined in the top surface of the bottom plate 222 for accommodating the heat pipes 30. Each second heat dissipation fin 24 defines two pairs of holes 240 in a middle thereof for the heat pipes 30 to extend therein, and forms flanges 242 at top and bottom ends thereof. The flanges 242 cooperatively form a top plane (not labeled) and a bottom plane (not labeled) for the fins 24. The bottom plane is soldered to a top surface of the top plate 224.

Each pair of the heat pipes 30 comprises two generally J-shaped heat pipes 30. Each heat pipe 30 comprises an evaporating portion 32 and a condensing portion 34 parallel to the evaporating portion 32. The evaporating portion 32 and the condensing portion 34 are located at two opposite ends of the heat pipe 30. The condensing portion 34 is much longer than the evaporating portion 32. The evaporating portions 32 of a first pair of the heat pipes 30 are inserted in the first grooves 1220 and soldered between the top and bottom plates 124, 122. The condensing portions 34 of the first pair of the heat pipes 30 are far away from the base 12 and respectively extended through the holes 140, 240 to thermally engage with the fins 14, 24. The evaporating portions 32 of a second pair of the heat pipes 30 are inserted in the second grooves (not shown) of the bottom plate 222 and soldered between the bottom plate 222 and the top plate 224. The condensing portions 34 of the second pair of the heat pipes 30 are far away from the base 22 and respectively extended through the holes 240, 140 to thermally engage with the fins 24, 14. Each heat pipe 30 further comprises a connecting portion 33 located between the evaporating portion 32 and the condensing portion 34 and the connecting portions 33 of the two pairs of the heat pipes 30 are located at two opposite outer sides of the first and second heat sinks 10, 20.

In operation, heat generated by the two electronic components transfer to the bases 12, 22. The bases 12, 22 absorb the heat and a part of the heat directly upwardly transfers to the first and second heat dissipation fins 14, 24. The other part of the heat is absorbed by the evaporating portions 32 of the heat pipes 30 and transferred to the first and second heat dissipation fins 14, 24 via the condensing portions 34 of the heat pipes 30. The heat received by the base 12 (22) can be transferred to the fins 14 (24) through a direct connection between the base 12 (22) and the fins 14 (24) and both the fins 14, 24 through a corresponding pair of the heat pipes 30. Thus, the heat dissipation device according to the present invention can effectively resolve the heat problem of a computer system having dual heat-generating components therein.

In an alternative embodiment, it is feasible that the bases 12, 22 are formed only by the bottom plates 122, 222. In such an alternative embodiment, the bottom planes of the fins 14, 24 are directly soldered to the top surfaces of the bottom plates 122, 222.

It is understood that the invention may be embodied in other forms without departing from the spirit thereof. Thus, the present examples and embodiments are to be considered in all respects as illustrative and not restrictive, and the invention is not to be limited to the details given herein.

We claim:

1. A heat dissipation device comprising:
   a first heat sink adapted for receiving heat from a first heat-generating electronic component, comprising a plurality of first heat dissipation fins;
   a second heat sink adapted for receiving heat from a second heat-generating electronic component, comprising a plurality of second heat dissipation fins; and
   at least two heat pipes, each heat pipe comprising an evaporating portion and a condensing portion;
   wherein the evaporating portion of one of the at least two heat pipes contacts with a first base of the first heat sink, the condensing portion of the one of the at least two heat pipes connecting the first heat sink and the second heat sink, and the evaporating portion of the other of the at least two heat pipes contacts with a second base of the second heat sink, the condensing portion of the other of the at least two heat pipes connecting the second heat sink and the first heat sink;
   wherein each of the at least two heat pipes further comprises a connecting portion between the evaporating portion and the condensing portion and the connecting portions of the at last two heat pipes are located at two opposite outer sides of the first and second heat sinks;
   wherein the evaporating portion and the condensing portion of each of the at least two heat pipes are located at two opposite ends of each of the at least two heat pipes and the condensing portion of each of the at least two heat pipes extends through the first and second heat sinks; and
   wherein the at least two heat pipes are substantially J-shaped and each of them comprises a first horizontal portion and a second horizontal portion, the first horizontal portions respectively connecting with the first and second bases, the second horizontal portions extending through the first and second heat dissipation fins.

2. The heat dissipation device as claimed in claim 1, wherein the first and second bases each have a bottom surface adapted for thermally contacting with a corresponding first/second heat generating electronic component.

3. The heat dissipation device as claimed in claim 2, wherein each of the first and second bases comprises a bottom plate and a top plate, the evaporating portions of the at least two heat pipes being sandwiched between the bottom plates and the top plates, respectively.

4. The heat dissipation device as claimed in claim 1, wherein the evaporating portions connecting with the first and second bases are tabular.

5. The heat dissipation device as claimed in claim 1, wherein each of the first and second bases comprises a bottom plate adapted for contacting with a corresponding first/second heat generating electronic component, and a top plate mounted on the bottom plate, the evaporating portion of each of the at least two heat pipes being sandwiched between the top and bottom plates and received in a groove defined in the bottom plate.

6. A heat dissipation device comprising:
   a first heat dissipation fins group adapted for thermally contacting with a first heat generating component;
   a second heat dissipation fins group beside the first heat dissipation fins group, adapted for thermally contacting with a second heat generating component; and
   two heat pipes each comprising an evaporating portion and a condensing portion, the evaporating portion and the condensing portion of each of the two heat pipes being located at two opposite ends of each of the heat pipes;
   wherein the evaporating portions of the heat pipes respectively thermally connect with bottom surfaces of the first and second heat dissipation fins groups and the condensing portions of the heat pipes extend through the first and second heat dissipation fins groups;
   wherein each of the two heat pipes further comprises a connecting portion located between the evaporating portion and the condensing portion of each of the two heat pipes and the connecting portions of the two heat pipes are located at two opposite outer sides of the first and second heat dissipation fins groups; and
   wherein the heat pipes are substantially J-shaped, the evaporating portions of the heat pipes being respectively connecting with the bottoms of the first and second heat dissipation fins groups, the condensing portions of the heat pipes being inserted in both the first and second heat dissipation fins groups.

7. A heat dissipation device comprising:
   a first heat sink having a base for contacting with a first heat generating electronic component and a plurality of fins extending from the base;

a second heat sink having a base for contacting with a second heat generating electronic component and a plurality of fins extending from the base of the second heat sink;

a first heat pipe having an evaporating portion thermally engaging with the base of the first heat sink and a condensing portion extending through the fins of the first heat sink and the fins of the second heat sink; and a second heat pipe having an evaporating portion thermally engaging with the base of the second heat sink and a condensing portion extending through the fins of the second heat sink and the fins of the first heat sink;

wherein each of the first and second heat pipes further comprises a connecting portion between the evaporating portion and the condensing portion thereof and the connecting portions of the first and second heat pipes are located at two opposite outer sides of the first and second heat sinks;

wherein the condensing and evaporating portions of each of the first and second heat pipes extend from two opposite ends of a corresponding one of the first and second heat pipes; and wherein the bases each have a bottom plate having a bottom surface for contacting with a corresponding first/second heat generating electronic component and a top surface defining a groove therein, the groove receiving the evaporating portion of a corresponding first/second heat pipe, and a top plate mounted on the top surface.

8. The heat dissipation device of claim 7, wherein the fins have bottom flanges cooperatively form bottom planes soldered respectively to top surfaces of the top plates of the bases.

9. The heat dissipation device as claimed in claim 7, wherein the evaporating portion of the first heat pipe is parallel to the condensing portion of the first heat pipe, and the evaporating portion of the second heat pipe is parallel to the condensing portion of the second heat pipe.

10. The heat dissipation device as claimed in claim 7, wherein the top plate has a recess defined in a bottom surface thereof, and the bottom plate is received in the recess.

11. The heat dissipation device as claimed in claim 7, wherein the condensing portions are longer than the evaporating portions.

* * * * *